United States Patent [15] 3,646,665
Kim [45] Mar. 7, 1972

[54] COMPLEMENTARY MIS-FET DEVICES AND METHOD OF FABRICATION

[72] Inventor: Man Jin Kim, Liverpool, N.Y.
[73] Assignee: General Electric Company

[22] Filed: May 22, 1970
[21] Appl. No.: 39,659

[52] U.S. Cl. ....................29/571, 29/578, 148/187
[51] Int. Cl. ....................B01j 17/00, H01g 13/00
[58] Field of Search ....................29/571, 578; 148/187

[56] References Cited

UNITED STATES PATENTS

| | | | |
|---|---|---|---|
| 3,391,035 | 7/1968 | MacKintosh | 148/187 |
| 3,461,361 | 8/1969 | Delivovias | 29/571 X |
| 3,566,518 | 3/1971 | Brown et al. | 29/578 X |

*Primary Examiner*—John F. Campbell
*Assistant Examiner*—W. Tupman
*Attorney*—Richard V. Lang, Marvin A. Goldenberg, Carl W. Baker, Frank L. Neuhauser, Oscar B. Waddell and Joseph B. Forman

[57] ABSTRACT

Complementary MIS-FET devices are fabricated with accurately controlled geometric and electrical properties so as to provide improvement in matching composite characteristics of device pairs, resulting in reduced power dissipation and increased speed of operation. As a related consideration, fabrication of these devices is described providing improved temperature-bias stability and radiation resistant properties. To realize the noted improvements self-aligning registration techniques are employed coupled with a simultaneous diffusion of drain and source regions. Further, improved gate dielectric compositions are employed.

12 Claims, 13 Drawing Figures

INVENTOR
MAN JIN KIM,
BY Marvin D. Goldenberg
HIS ATTORNEY.

INVENTOR:
MAN JIN KIM,
BY Marvin L. [signature]
HIS ATTORNEY.

COMPLEMENTARY MIS-FET DEVICES AND METHOD OF FABRICATION

BACKGROUND OF THE INVENTION

1. Field of the Invention

The invention relates generally to the field of FET device arrays and methods of fabrication, and more particularly to the area of MOS-FET and MIS-FET devices. MIS-FET is a generic term referring to a field effect transistor of similar type to the MOS-FET but where the dielectric under the metallized gate and over the semiconductor substrate is not limited to pure oxide but may include oxide mixtures or other types of insulating material.

2. Description of the Prior Art

Complementary MOS-FET devices have been described in the literature. These devices when properly fabricated, i.e., with stable and matching electrical properties, possess advantages over discrete devices of increased speed and reduced power supply voltage and power dissipation. However, fabrication techniques currently employed by workers in the field make it difficult to fully realize these potential advantages. In addition, present-day devices normally become unstable in a radiation environment, such application becoming of increasing interest.

SUMMARY OF THE INVENTION

It is accordingly an object of the invention to provide improved methods of fabricating complementary MIS-FET device structures which result in improved matching of composite device characteristics, thereby increasing speed of operation of reducing power dissipation.

It is a further object of the invention to provide improvement in methods of fabricating complementary MIS-FET devices so they will exhibit greater stability to temperature-bias and radiation effects.

Another object of the invention is to more accurately control the geometries and electrical properties of complementary MIS-FET devices.

A further object of the invention is to provide an improved fabrication of complementary MIS-FET devices for establishing low threshold voltages compatible with bipolar logic operation.

Yet another object of the invention is to reduce complexity in the fabrication of monolithic arrays of complementary MIS-FET devices.

A further object of the invention is to provide improved complementary MIS-FET structures which exhibit the above-recited properties.

These and additional objects of the invention are accomplished by a fabrication process which in accordance with one embodiment of the invention comprises the steps of preparing a semiconductor substrate of one conductivity type with an overlaid insulating film and forming within the substrate through an opening in the film a relatively large diffused region of opposite conductivity type which acts as a substrate for one MIS-FET device of a pair of complementary devices; the other device of said pair being located outside of said diffused region. Gate electrodes are formed on the substrate for each of the complementary devices. Subsequently, in a simultaneous diffusion process drain-source regions of said one device are diffused in with said one conductivity type and drain-source regions of said other device are diffused in with said opposite conductivity type, the gate electrodes serving to mask this diffusion process. There is accordingly provided an accurate control of channel dimensions between the drain-source regions of said complementary devices.

In accordance with a further embodiment of the invention, the gate dielectric may be composed of a two-layer structure of compensating materials for improving temperature-bias stability and radiation resistant properties of the devices.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DETAILED DESCRIPTION OF PREFERRED EMBODIMENTS

A complementary MIS-FET device structure and method of fabrication, in accordance with a first embodiment of the invention, is illustrated in the cross-sectional views of FIGS. 1A through 1J. A plan view of a portion of the completed structure is shown in FIG. 1K. The present method makes possible the ready fabrication of these devices with accurately controlled geometric and electrical properties so as to provide good matching of composite characteristics between device pairs. The devices will therefore exhibit high speed of operation and low power dissipation. The process steps and material compositions are described herein with specificity for the purpose of clear and complete disclosure. However, it should be clear that the invention is not limited to such specific recitations and numerous modifications and variations may be made by ones skilled in the art with respect to both material compositions and specific process steps which would not exceed the basic inventive concepts herein presented.

Figure 1A:
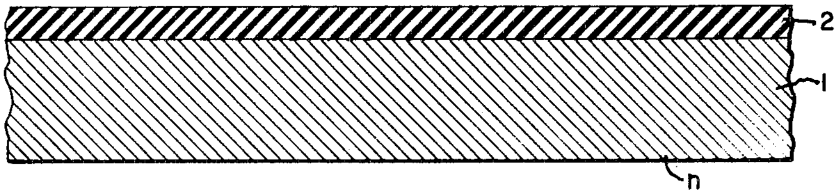
FIGS. 1A through 1J are a sequence of schematic views in cross section illustrating individual steps in the process of fabricating a complementary MIS-FET structure in accordance with one embodiment of the invention.

Referring to FIG. 1A, a wafer or substrate 1 is initially overlaid with an insulating oxide layer 2. The starting material for the substrate 1 may be single-crystal N-type silicon with a 100 orientation, having a resistivity in the order of 2 ohm-centimeters. However, for practicing the present method other silicon compositions and other semiconductor materials may be employed for the substrate, such as germanium, gallium arsenide, gallium phosphide, etc. The substrate 1 is treated in a suitable furnace to a temperature of about 1,200° C. and steam is introduced for about 90 minutes, which produces a high-purity $SiO_2$ layer about 10,000 A. thick. For other semiconductor materials, other insulating layers will normally be applied, such as silicon nitride, $Si_3N_4$, or aluminum oxide, $Al_2O_3$.

Figure 1B:
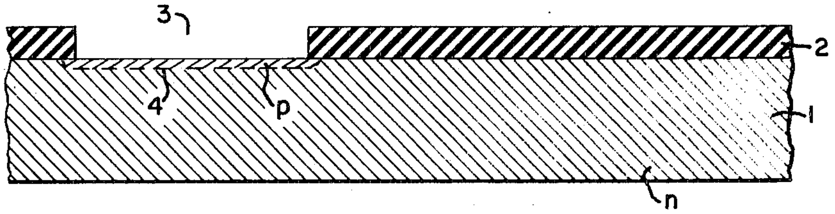
Figure 1C:
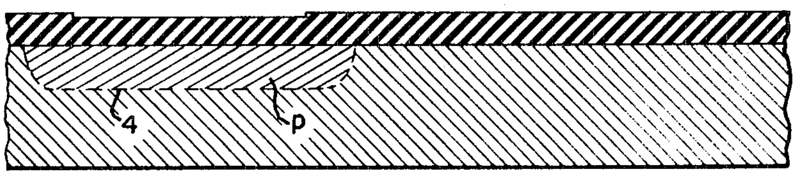

By means of conventional photolithographic processing and using a first photoresist mask, a rectangular window 3 is etched in the $SiO_2$ layer 2. This is shown in FIG. 1B. As will be seen, the window is opened to provide a relatively large P-type region which forms the N-channel substrate. A suitable dopant material is deposited through the window 3 for diffusing in the P-type region 4. This has been accomplished by the application of 0.25 percent boron trichloride gas in nitrogen gas with a flow rate of about 3 cc. per minute for about 60 minutes, at a temperature of approximately 1,120° C. During this process boron glass forms on the surface and must be cleaned off. The boron is then driven-in by setting the temperature to about 1,200° C. and applying dry oxygen for about 15 hours followed by nitrogen for about 20 hours. This step results in a sheet resistivity of about 480 ohms per square of the expanded P-type region, corresponding to a surface concentration of $10^{17}$ atoms per $cm.^3$, and a junction penetration depth of about 1 mil. This is shown in FIG. 1C. Since the surface concentration contributes appreciably to the threshold voltage, its reproducibility is very important. During the drivein process, an oxide forms on the surface of the substrate within the window, as illustrated in FIG. 1C.

Employing a second photoresist mask, two rectangular windows 5 and 6, corresponding in size to the active devices to be formed and smaller than the window 3, are etched in the $SiO_2$ layer 2. The $SiO_2$ is completely etched down to the substrate. Thin layers of $SiO_2$ are then grown in the windows 5 and 6 to about 1,200 A. thickness, shown in FIG. 1D. A clean, dry oxygen is used at about 1,000° C. for 4 hours. The wafer is then annealed in a nitrogen atmosphere at about 1,120° C. for 2 hours for reducing the surface state density, generally to less than 1×10-inch states/cm². Immediately prior to the subsequent step in the process, about 200 A. of $SiO_2$ is etched away to leave about 1,000 A. of absolutely clean $SiO_2$.

Figure 1D:
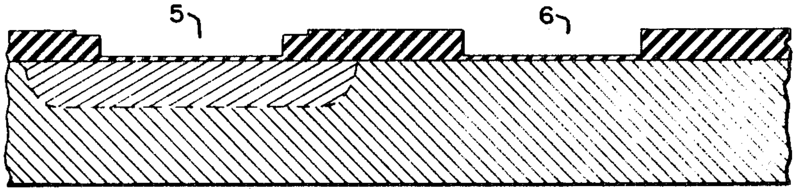
Figure 1E:
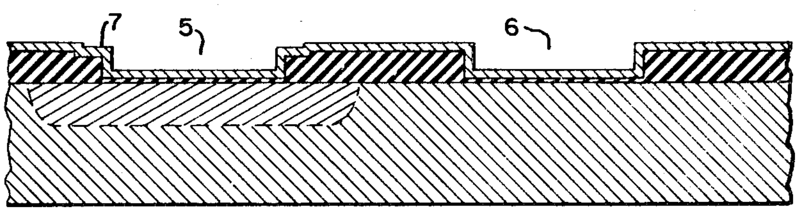
Figure 1F:
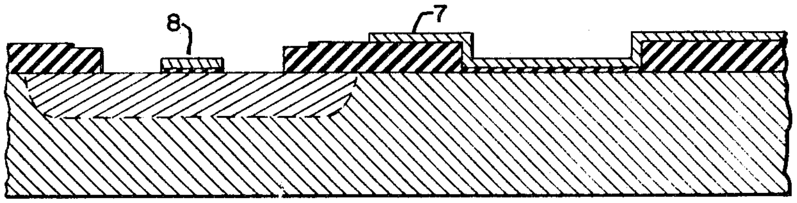

The oxide surface is next back sputtered slightly and has deposited a refractory metal, such as molybdenum or tungsten, which adheres well to the silicon oxide and can act as a mask to subsequent diffusion processing. In the present example a molybdenum layer 7 is deposited to 3,000 A. by electron beam evaporation. This is illustrated in FIG. 1E. A third photoresist mask is employed to etch the molybdenum over the N-channel substrate, leaving a ½-mil wide gate strip in the middle of the window 5. The thin layer $SiO_2$ at either side of the gate within the window 5 is then etched completely away. For this step, the molybdenum may serve as a mask or an additional photoresist mask can be used. The resulting structure is illustrated in FIG. 1F wherein it is seen that the gate 8 divides the window 5 into two equal parts within which drain and source regions of the N-channel device are to be formed.

Figure 1G:
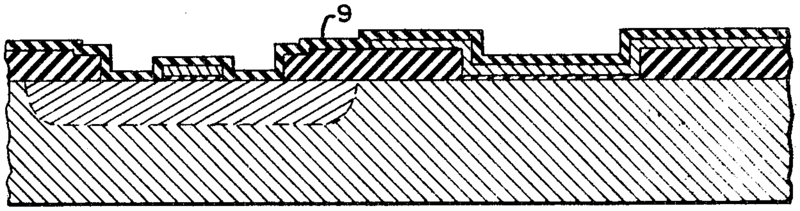

In the next step of the process, a film 9 of doped $SiO_2$ with N-type impurity is deposited over the entire wafer. In the present example the oxide is deposited by a reaction of 3% $SiH_4$ with dry $0_2$ in a stream of $N_2$. Phosphorus doped $SiO_2$ of about 5,000 A. is deposited using a $PH_3$ doping source, at a deposition rate of 200 A. per minute at 500° C. The doped oxide film 9, illustrated in FIG. 1G, provides the N-type source for the N-channel formation. Using a fourth photoresist mask the doped oxide film 9 and then the molybdenum are etched away where there is to be a P-channel formation, leaving a ½-mil wide gate strip 10 in the middle of the window 6 and a crossover strip 11. The gate strips 8 and 10 may extend into an interconnection structure which together with strip 11 form an overall conductor pattern on the substrate. The thin layer of $SiO_2$ at either side of the P-channel gate is then etched away. This structure is illustrated in FIG. 1H.

Figures 1H, 1I, 1J, 1K, 2B:
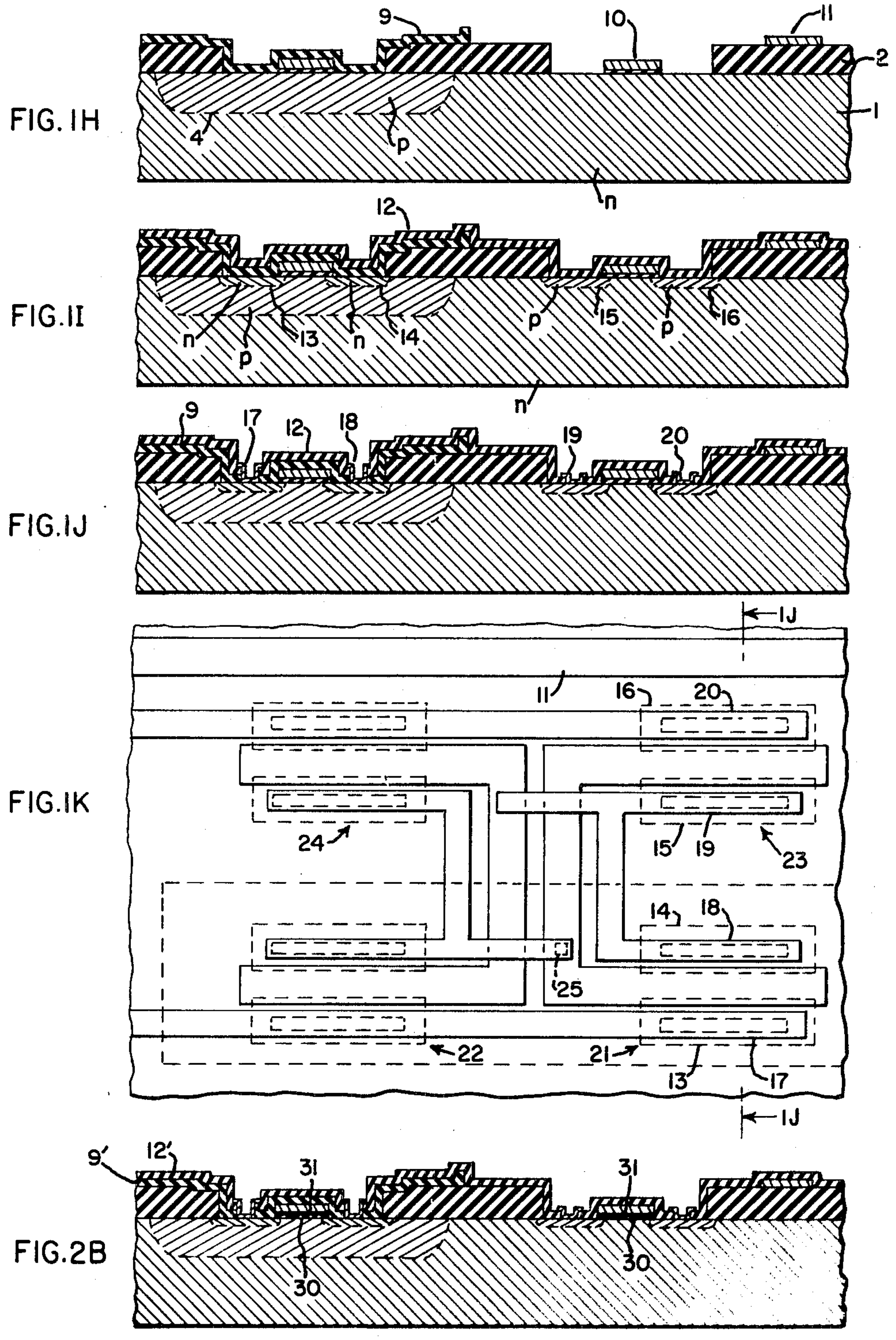
FIG. 1K is a schematic plan view of the completed structure corresponding to the cross section of FIG. 1J.
FIGS. 2A and 2B are schematic views illustrating two steps in the process of fabricating a modified complementary MIS-FET structure of improved temperature-bias stability and radiation resistant properties.

As shown in FIG. 1I, a film 12 of doped $SiO_2$ with P-type impurity is then deposited to a thickness of 5,000 A. over the entire wafer. Similar to deposition of the phosphorus doped $SiO_2$, the oxide is deposited by a reaction of 3% $SiH_4$ with dry $O_2$ in a $N_2$ stream. The oxide is deposited using a $B_2H_6$ doping source at a deposition rate of 200 A. per minute at 500° C. The low-temperature processes for deposition of both the boron and phosphorus doped oxides do not induce any dopant diffusion. After deposition of the boron doped oxide film, the N-channel drain-source regions 13 and 14, and P-channel drain source regions 15 and 16 are simultaneously driven into their respective substrates. The phosphorus and boron are driven in for about 6 minutes at 1,150° C. for a junction penetration of 0.25 microns. The molybdenum gate electrodes 8 and 10 mask the phosphorus and boron oxides during the diffusion process. By covering the molybdenum with oxide, the Mo will not be lost as an oxide. As a result of an accurate registration of the gate electrodes within the windows 5 and 6 and the described simultaneous diffusion processing, accurate control of channel dimensions and a matching channel length for the N- and P-channel devices can be readily accomplished. The observed channel mobility is 230 cm.²/V-sec. for electrons and 150 cm.²/V.-sec. for holes. Thus, by making the P-channel width proportionately greater than the N-channel width, the transductances of the complementary devices can be accurately matched. Further, overlap of the gate electrodes and the drain and source regions is restricted to about the depth of the junction, thus limiting the overlap capacitance *Cgo*, which is between the diffused regions and the gate electrode. For 0.25 micron overlap, the value of *cgo* is about 0.0085 picofarad for about 4 mil widths.

It should be noted than an alternative sequence of steps can as well be employed wherein the boron doped oxide film is deposited first and the phosphorus doped oxide film deposited second. The result after simultaneous diffusion of the drain-source regions for complementary devices will be the same. Further, the drain-source regions can be diffused through an oxide film.

Using a fifth photoresist mask openings are made through the oxide layers 9 and 12 over the drain-source regions 13–16 of the N- and P-channel devices. Openings in the layer 9 and 12 are also made at appropriate places in the array structure over Mo electrodes remote from the devices. A film of aluminum about 6,000 A. thick is deposited over the entire wafer by electron beam evaporation, the aluminum entering the formed openings and making contact with the drain-source diffused regions and the Mo electrodes. Conductor leads are etched from the Al film by means of a sixth photoresist mask. The completed structure, showing conductor leads 17, 18, 19 and 20 over drain-source regions 13 to 16, respectively, is shown in FIG. 1J. In FIG. 1K is a plan view of a very small portion of a completed array structure illustrating two pair of complementary MIS-FET devices. In FIG. 1K is shown a plane 1J—1J through which the cross-sectional view of FIG. 1J is taken. FIG. 1K shows N-channel devices 21 and 22, P-channel devices 23 and 24 and their interconnection structure. Connection to the gate electrode of devices 21 and 23 is at contact 25.

In one alternative embodiment of the structure illustrated in FIGS. 1A to 1K, polycrystalline silicon is employed in lieu of a refractory metal for the electrode material. Thus, the layer 7 is deposited as polycrystalline silicon, the process steps otherwise being the same as described. For this embodiment, during diffusion of the drain-source regions 13 to 16, the phosphorus oxide layer overlaying the gate electrode 8 will diffuse an N-type dopant into the polycrystalline silicon, resulting in an N-doped electrode. Correspondingly, the boron oxide layer overlaying the gate electrode 10 will diffuse a P-type dopant into the polycrystalline silicon material, resulting in a P-doped electrode.

The structures thus far considered have employed pure $SiO_2$ with a thickness of about 1,000 A. as the gate dielectric. However, $SiO_2$ has an excess of positive charge and hole traps, and is not an optimum dielectric material. At high bias levels and/or high-temperature environments, the devices tend to become unstable due to movement of charge to the interface between the $SiO_2$ layer and the silicon substrate. In particular, the threshold voltages are affected. In addition, when the devices are exposed to radiation, positive space charge is created in the $SiO_2$ which can move the threshold by as much as 100 volts at high dosage, e.g., $10^{15}$e./cm². The model generally accepted to explain the build up of positive space charge assumes that the primary effect of the ionizing radiation is to create hole-electron pairs in the oxide. The mobility-lifetime product associated with the motion of the radiation induced electron is much greater than that of holes. Consequently, electrons are able to drift relatively large distances from their point of creation and often escape the oxide altogether. The holes, on the other hand, having smaller mobility-lifetime product primarily become trapped in the oxide, creating net positive charge.

Figure 2A:
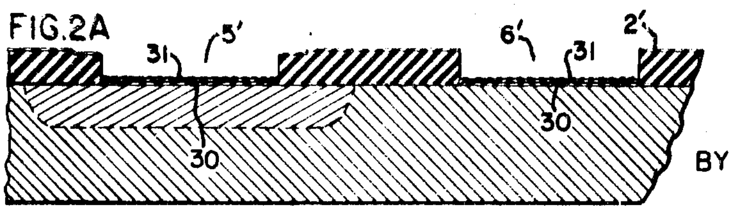

The effects of radiation can be compensated for, while also providing improvement in temperature-bias stability of the complementary devices, by fabricating the gate dielectric material in the form of a double-layer structure, the first layer being $SiO_2$ and the second layer a suitable compensated or compensating material. This embodiment of the complementary MIS-FET device array is fabricated in essentially the same manner as described with respect to the embodiment of FIG. 1A through 1K. However, as shown in FIGS. 2A and 2B, the $SiO_2$ layer 30 under the gate electrodes is very thin, in the order of 50 A. to 300 A., and is superimposed with a second layer 31, which has a thickness in the order of 700 A. to 1,000 A. FIG. 2A corresponds in the fabrication process to the step illustrated in FIG. 1D, and FIG. 2B illustrates the completed structure. Similar elements to those in the first embodiment are identified with the same reference character and an added prime notation. The remaining steps in the process will be as illustrated with respect to the first embodiment.

The thin $SiO_2$ layer 30 provides the necessary structural and thermal matching at the interface with the silicon substrate. The second layer is a passivation layer having, generally, a higher dielectric constant than $SiO_2$. It is preferably a compensated material composed of a mixture of dielectric material exhibiting an excess of electron traps and $SiO_2$, the mixture being prepared so that the excess electron traps of the added material compensate the excess hole traps of the $SiO_2$. One suitable material that has been employed for the second layer is a mixture of silicon nitride and silicon oxide, termed oxynitride, for which the chemical reaction is as follows:

$$SiH_4+NH_3+NO+H_2 \rightarrow Si_xN_yO_z \quad (1)$$

*x*, *y* and *z* being determined by the ratio $NH_3/NO$

The sources are in gaseous form, being combined and deposited on the $SiO_2$ in a pyrolytic decomposition at about 800° C.

A second suitable material that has been employed is a mixture of aluminum oxide and silicon oxide, for which the chemical reaction is as follows:

$$AlCl_3+SiCl_4+CO_2+H_2 \rightarrow (Al_2O_3)_x(SiO_2)_y \quad (2)$$

*x* and *y* being determined by the ratio $AlCl_3/SiCl_4$.

Regulated amounts of hydrogen are bubbled through $SiCl_4$ and caused to flow over $AlCl_3$ heated to about 100° C., the combined gases being introduced with the wafer into a reaction chamber heated to about 750° C. The double-layer gate dielectric structure comprising the two mixtures referred to above have been found to stabilize the threshold voltage of the complementary MIS-FET devices to within 1 volt for radiation dosages in the order of $10^{15}$e./cm$^2$. The threshold voltages have also been reduced to in the order of 1 to 2 volts, and made stable there for temperatures as high as 160° C.

The second layer 31 may also be in the form of a compensating material, such as a film of $Si_3N_4$ or $Al_2O_3$. For this construction, the relative thickness of the $SiO_2$ film and the covering film is critical in order to provide optimum compensation.

The described methods of fabrication are also applicable to P-type substrates wherein the large diffused area is N-type and form the P-channel substrate. For this structure the N-channel device is outside the large diffused area. Considering a silicon substrate, a thin film of $SiO_2$ covers the substrate, in the order of 50 A. To 300 A. overlaying the thin $SiO_2$ film is a film of a material possessing excess negative charge, such as $Al_2O_3$ or $TiO_2$a for reducing the surface state density. The water is then annealed as previously described forfurther reducing the surface state density. The remainder of the processing may be as described with respect to the foregoing embodiments.

What I claim as new and desire to secure by Letters Patent of the United States is:

1. A method of fabricating a complementary MIS-FET device structure comprising the steps of:
   a. forming an insulating layer over the surface of a semiconductor substrate of one conductivity type,
   b. diffusing into said substrate through an opening in said layer a large region of opposite conductivity type to said one conductivity type, the diffused region acting as a substrate for one MIS-FET device of a complementary pair of devices, the other device of said pair being located outside of said diffused region,
   c. depositing on said substrate a gate electrode overlaying a gate dielectric, one for each of the complementary devices, and
   d. simultaneously diffusing in the drain-source regions of said one device as said one conductivity type and the drain-source regions of said other device as said opposite conductivity type, the gate electrodes serving to mask the simultaneous diffusion process. Overlaying the thin , wafer is then annealed as previously described for further reducing 2. A method as in claim 1 wherein said substrate is silicon and said gate dielectric is composed of two layers, the first layer being silicon dioxide and the second layer being a passivation material of relatively high dielectric constant.

3. A method of fabricating a complementary MIS-FET device structure comprising the steps of:
   a. forming an insulating layer over the surface of a semiconductor substrate of one conductivity type,
   b. etching a large opening in said insulating layer,
   c. diffusing into said substrate through said opening a large region of opposite conductivity type to said one conductivity type, the diffused region acting as a substrate for one MIS-FET device of a complementary pair of devices, the other device of said pair being located outside of said diffused region,
   d. etching a pair of openings in a re-formed insulating film, said openings defining the boundary dimensions of said complementary devices,
   e. forming on said substrate within each opening a gate electrode overlaying a gate dielectric which divide the opening into two equal parts corresponding to the drain-source regions of the devices,
   f. forming a first doped film having an impurity of said one conductivity type within the opening corresponding to said one device,
   g. forming a second doped film having an impurity of said opposite conductivity type within the opening corresponding to said other device,
   h. simultaneously diffusing in the drain-source regions of said one device as said one conductivity type and the drain-source regions of said other device as said opposite conductivity type, the gate electrodes serving to mask the simultaneous diffusion process, and
   i. making electrical contact to said devices through small openings etched in said doped films.

4. A method as in claim 3 wherein said first and second doped films are formed directly on the substrate surface.

5. A method as in claim 3 wherein prior to forming the gate electrodes, a thin insulting layer exists on the substrate surface within said pair of openings, said gate electrodes and gate dielectric being formed by depositing a layer of electrode material over the substrate insulation and selectively etching said electrode material and said thin insulating layer.

6. A method as in claim 5 wherein said substrate is N-type silicon, said insulating layer is silicon dioxide, said first doped film is phosphorus doped silicon dioxide and said second doped film is boron doped silicon dioxide.

7. A method as in claim 6 wherein said electrode material is a refractory metal.

8. A method as in claim 7 wherein during the formation of said gate electrodes a conductor pattern is also formed by said selective etching of the electrode material, at east one of the doped oxide films overlaying said gate electrodes and conductor pattern.

9. A method as in claim 6 wherein said electrode material is polycrystalline silicon.

10. A method as in claim 3 wherein said substrate is silicon and said gate dielectric is composed of two layers, the first layer being silicon dioxide and the second layer being a passivation material of relatively high dielectric constant.

11. A method as in claim 10 wherein said second layer is composed of a mixture of silicon nitride and silicon dioxide.

12. A method as in claim 10 wherein said second layer is composed of a mixture of aluminum oxide and silicon oxide.

* * * * *

PO-1050
(5/69)

UNITED STATES PATENT OFFICE
CERTIFICATE OF CORRECTION

Patent No. 3,646,665 Dated March 7, 1972

Inventor(s) Man Jin Kim

It is certified that error appears in the above-identified patent and that said Letters Patent are hereby corrected as shown below:

Column 3, line 12 Change "1 X 10-inch" to --1 X $10^{11}$--
Column 4, line 2 Change "cgo" to --Cgo--
Column 5, line 49 Change "50A. To 300A. overlaying" to --50A. to 300A. Overlaying--
line 51 Change "$TiO_2$ a" to --$TiO_2$,--; Change "water" to --wafer--
Column 6, lines 4, 5, 6 Delete "Overlaying the thin , wafer is then annealed as previously described for further reducing--

Signed and sealed this 8th day of August 1972.

(SEAL)
Attest:

EDWARD M.FLETCHER,JR. ROBERT GOTTSCHALK
Attesting Officer Commissioner of Patents